US009835687B2

(12) United States Patent
Edwards et al.

(10) Patent No.: US 9,835,687 B2
(45) Date of Patent: Dec. 5, 2017

(54) SYSTEM AND METHOD FOR SWITCH STATUS DETECTION

(71) Applicants: William E. Edwards, Ann Arbor, MI (US); Anthony F. Andresen, Chandler, AZ (US)

(72) Inventors: William E. Edwards, Ann Arbor, MI (US); Anthony F. Andresen, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 61 days.

(21) Appl. No.: 14/573,407

(22) Filed: Dec. 17, 2014

(65) Prior Publication Data

US 2016/0182033 A1 Jun. 23, 2016

(51) Int. Cl.
*G01R 31/327* (2006.01)
*H03K 17/18* (2006.01)
*H03K 5/00* (2006.01)
*H02B 1/24* (2006.01)
*H01H 71/04* (2006.01)

(52) U.S. Cl.
CPC ......... *G01R 31/3277* (2013.01); *H01H 71/04* (2013.01)

(58) Field of Classification Search
CPC ........ G01R 31/327; H03K 17/18; H03K 5/00; H02B 1/24
USPC ............... 324/415, 418, 422; 307/128, 130; 327/74, 77, 87
See application file for complete search history.

(56) References Cited

U.S. PATENT DOCUMENTS

| 5,387,882 | A | * | 2/1995 | Schoofs | ................... H03K 4/50 331/111 |
| 5,798,663 | A | * | 8/1998 | Fugere | ............... H03K 3/02337 327/205 |
| 6,800,965 | B1 | | 10/2004 | Turner et al. | |
| 7,518,413 | B2 | | 4/2009 | Kurihara | |
| 8,278,932 | B2 | | 10/2012 | Quinones et al. | |

(Continued)

FOREIGN PATENT DOCUMENTS

EP 1240654 B1 2/2004

OTHER PUBLICATIONS

U.S. Appl. No. 14/573,350, filed Dec. 17, 2014, entitled "System and Method for Switch Status Detection" (40 pgs.).

(Continued)

*Primary Examiner* — Son Le
*Assistant Examiner* — Neel Shah

(57) ABSTRACT

Systems, methods, and circuits for determining one or more switch statuses are disclosed herein. In one example embodiment, such a system includes a first port configured to be coupled to a switch, a capacitor, a comparator having first and second input ports and an output port, a current source coupled to the first input port, and a control component. The first input port is coupled to the first port and a threshold voltage if applied to the second input port. The control component is configured so that, in at least one circumstance, it causes the current source to cease driving the current in response to receiving an indication from the output port indicating that an additional voltage applied to the first input port has changed from being less than the threshold voltage to being greater than that voltage, the indication being indicative of the switch status.

15 Claims, 5 Drawing Sheets

(56) References Cited

U.S. PATENT DOCUMENTS

| | | | |
|---|---|---|---|
| 2009/0261806 A1* | 10/2009 | Benabdelaziz | G01R 19/16538 |
| | | | 324/76.11 |
| 2013/0207693 A1* | 8/2013 | Kao | H03K 19/00369 |
| | | | 327/87 |
| 2013/0214805 A1 | 8/2013 | Soloio, Jr. et al. | |
| 2014/0084885 A1* | 3/2014 | Ouyang | H02M 3/158 |
| | | | 323/271 |
| 2015/0187335 A1* | 7/2015 | Sugiyama | G09G 3/32 |
| | | | 345/208 |
| 2015/0346282 A1* | 12/2015 | Jeon | G01R 31/3278 |
| | | | 324/418 |

OTHER PUBLICATIONS

U.S. Appl. No. 14/573,350, Inventor William E. Edwards, "System and Method for Switch Status Detection", filed Dec. 17, 2014, Office Action—Restriction, mailed Jul. 1, 2016.

U.S. Appl. No. 14/573,350, Inventor William E. Edwards, "System and Method for Switch Status Detection", filed Dec. 17, 2014, Office Action-Non-final Rejection, dated Oct. 20, 2016.

U.S. Appl. No. 14/573,350, Inventor William E. Edwards, "System and Method for Switch Status Detection", filed Dec. 17, 2014, Office Action-Final Rejection, dated May 4, 2017.

* cited by examiner

SYSTEM AND METHOD FOR SWITCH STATUS DETECTION

CROSS-REFERENCE TO RELATED APPLICATIONS

--

STATEMENT REGARDING FEDERALLY SPONSORED RESEARCH OR DEVELOPMENT

--

FIELD OF THE DISCLOSURE

The present disclosure relates to systems and methods that perform control or monitoring operations and, more particularly, to systems and methods for detecting statuses of switches.

BACKGROUND OF THE DISCLOSURE

In many environments and operational circumstances in which switches (or switching devices) are present, the statuses of the switches can be of importance or of interest for any of a variety of reasons. For example, in automotive systems, control actions sometimes should be taken based at least in part upon whether a switch is open or closed. At the same time, determining the status of a given switch commonly can involve providing a current toward the switch and sensing whether some parameter dependent upon the open or closed status of the switch has a particular characteristic or varies in a particular manner. Yet such a manner of determining the status of a switch can involve significant power usage and, in systems such as automotive systems where such power can be provided from a battery, result in depletion of the battery.

Again for example with respect to automotive systems, in order to reduce the amount of power usage associated with determining the statuses of switches, testing can be performed in an intermittent manner—e.g., the statuses of the switches can be periodically sampled. Further for example, in some conventional arrangements, an integrated circuit that is performing the testing is usually in a low power mode (LPM) with the car engine off, but periodically awakens to poll switches to determine their statuses, and more particularly to determine if any switch has changed state (e.g., due to a door handle being activated). Even though such arrangements permit determining of the statuses of switches in a manner that involves a limited amount of current flow and corresponding power usage, such arrangements still entail undesirably high levels of power usage. For these and/or other reasons it would be advantageous if improved systems or methods for switch status detection could be developed.

DETAILED DESCRIPTION

The present disclosure relates to systems and methods for determining the statuses of switches, and more particularly relates to such systems and methods that achieve such status determinations by way of manners of operation that minimize (or involve reduced levels of) quiescent current drain and concomitant power usage and thus can achieve such status determinations in manners of operation that minimize (or involve reduced levels of) power depletion of a battery. Also, in at least some such embodiments, the systems and methods can perform these status determinations even while providing adequate noise margins. Also, in at least some embodiments, the detecting of the state of a single pole, single throw (SPST) switch (or switches) configured either as a high side switch (switch to battery or "SB") or a low side switch (switch to ground or "SG") and minimizing quiescent current drain on a battery while providing adequate noise margin.

Figure 1:
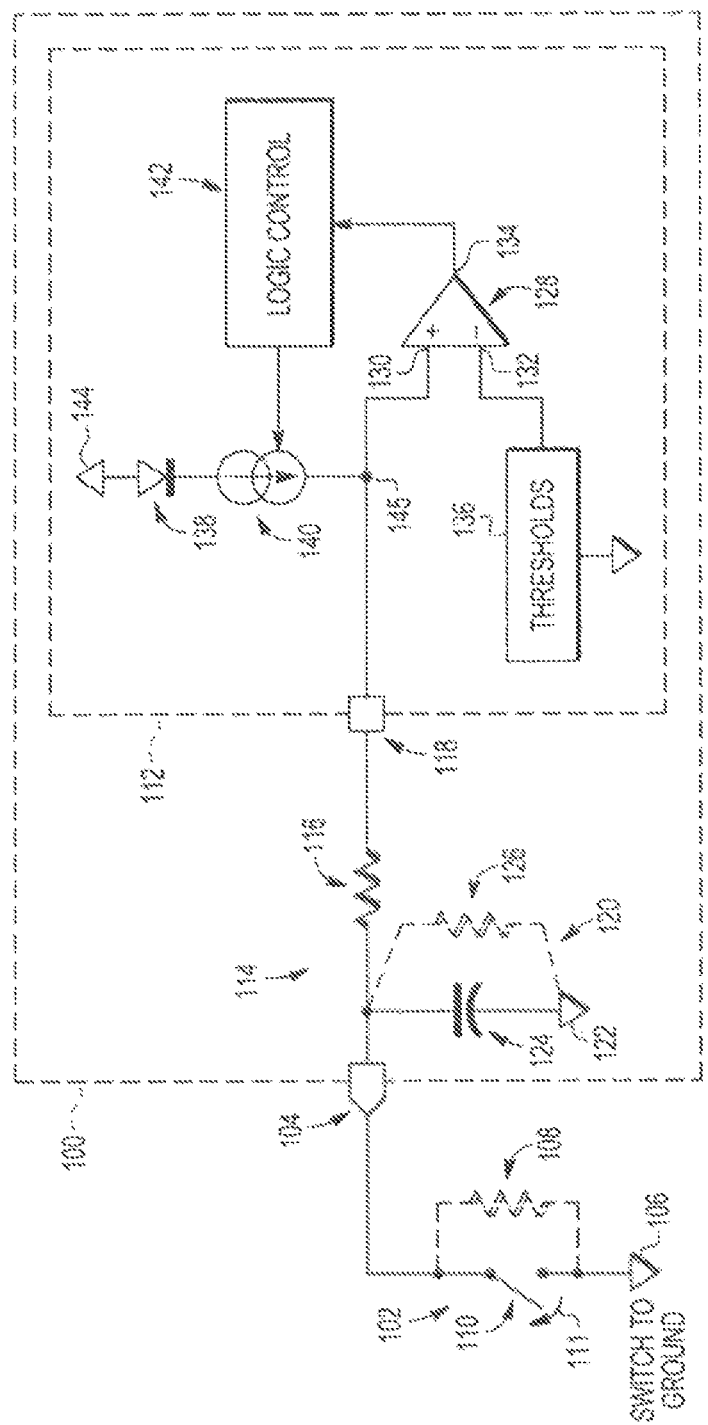
FIG. 1 is a schematic diagram illustrating example components of a switch status detection system in accordance with an embodiment of the present disclosure.

Referring to FIG. 1, a schematic diagram illustrates a system 100 that is in electrical communication with a switch 102 in accordance with one embodiment of the present disclosure. As described in further detail below, the system 100 particularly is configured for determining the status (e.g., the open or closed status, or open-circuited or short-circuited status) of the switch 102. Depending upon the embodiment, the system 100 can be implemented in any of a variety of manners including, for example, on an integrated circuit, by way of one or more dedicated circuit components, or by way of a combination of an integrated circuit and one or more dedicated circuit components. Also, although depending upon the embodiment the switch can take any of a variety of forms, in the present embodiment the switch 102 is a single pole, single throw (SPST) switch.

As further illustrated, in the present embodiment the switch 102 particularly is connected between an output terminal 104 of the system 100 and ground, which is represented by a terminal 106, and thus the arrangement with the switch 102 can be considered a "switch to ground" arrangement. The switch 102 can be considered to have a leakage resistance 108 (shown in phantom) associated therewith such that some current can pass between the output terminal 104 and the ground terminal represented by the terminal 106 even when a throw 110 of the switch is open. Accordingly, the leakage resistance 108 is shown to be coupled in parallel with the throw 110 of the switch 102. It will be appreciated that the throw 110 of the switch 102 can be moved in a direction indicated by an arrow 111 and also in a direction opposite that represented by the arrow. When the throw 110 is moved in the direction indicated by the arrow 111 to a position as shown in FIG. 1, the switch has an open or open-circuited status, and when the throw 110 is moved in the direction opposite to the arrow, the switch ultimately (e.g., when the throw contacts the remainder of the switch 102) takes on a closed or short-circuited status.

Additionally as shown, the system 100 particularly includes a switch to ground (SG) circuit 112 and additional circuitry 114. The additional circuitry 114 includes a resistor 116 that links an output terminal 118 of the SG circuit 112 with the output terminal 104 of the system 100. In the present embodiment, the resistor 116 has a small resistance value such as 50 ohms or 100 ohms such that the voltage drop across the resistor during operation of the system 100, and particularly when current is driven through the resistor as described below, is small. The additional circuitry 114 also includes a capacitor 120 that is coupled between the output terminal 104 (or a link connecting the resistor 116 with the output terminal 104) and ground as represented by a terminal 122. The capacitor 120 is shown to include both a capacitive formation (e.g., corresponding to capacitor plates) 124 as well as a leakage resistance 126 (shown in phantom) coupled in parallel with that capacitive formation. Due to the leakage resistance 126, the capacitor 120 does not retain a charged status indefinitely. In at least some embodiments, the capacitor 120 can have a capacitance of 200 nanoFarads. Generally, in the present embodiment, capacitor leak down can be caused by either the resistance 126 or the resistance 108.

The SG circuit 112 is shown to include a comparator 128 having a non-inverting (input) terminal 130 and an inverting (input) terminal 132 as well as an output terminal 134. The comparator 128 in at least some embodiments can be an operational amplifier. The non-inverting terminal 130 is coupled to the output terminal 118 of the SG circuit 112, and the inverting terminal 132 is coupled to a voltage threshold block 136. It should be appreciated that the voltage threshold block 136 is intended to be representative of any of a variety of circuit components that are capable of applying one or more threshold voltages to the inverting terminal 132. In some embodiments or circumstances, only one threshold voltage is or can be applied to the inverting terminal 132 (e.g., 4 Volts), while in other embodiments or circumstances multiple different threshold voltages can be applied depending upon one or more operational or selection criteria. In one example embodiment, the threshold voltage block 136 merely is circuitry that forms a voltage divider between a voltage source and ground and that sets the inverting terminal 132 to a particular voltage level that is less than the voltage source voltage level (assuming that the voltage source voltage level is a positive voltage).

In addition, the SG circuit 112 further includes a diode 138, a current source 140, and a logic controller 142. As shown, in the present embodiment, the diode 138 is coupled between a voltage source terminal 144 and the current source 140. More particularly, the anode of the diode 138 is coupled to the voltage source terminal 144 and the cathode of the diode is coupled to the current source 140. Additionally, the current source 140 is coupled between the diode 138 and a node 145 that is common to the output terminal 118 and the non-inverting terminal 130 (or to a link forming such a node), and thus the current source 140 is directly coupled to (or short-circuited to) each of the output terminal 118 and the non-inverting terminal 130. It should be noted that, although the present embodiment includes the diode 138, the diode should be considered optional and need not be present in other embodiments (in some such embodiments, therefore, the current source 140 is coupled directly to the voltage source terminal 144). The current source is orientated to direct current flow from the diode 138 (passing through the diode) toward the node 145. Because the non-inverting terminal 130 of the comparator 128 is high impedance and does not receive current, any current driven by the current source 140 is driven out of the SG circuit 112 by way of the output terminal 118 and through the resistor 116 and then further through either the output terminal 104 or through the capacitor 120, depending upon whether the switch 102 is open or closed. It should be understood that the current source 140 can take a variety of forms depending upon the embodiment including, for example, simply a resistor (or variable resistor), a transistor current source or current mirror, or a regulated current loop or current source.

Finally, FIG. 1 also shows that the logic controller 142 is coupled to the output terminal 134 of the comparator 128 and additionally is coupled to the current source 140. Based upon the signals received from the comparator 128 via the output terminal 134, and based upon the programming or other circuit characteristics of the logic controller 142, the logic controller controls whether the current source 140 is turned on or off so as to generate or not generate. In this regard, in the present embodiment, the logic controller 142 merely controls whether the current source 140 is turned on so as to generate a specified constant (or substantially constant) magnitude of current (typically direct current or DC), or turned off so that no current is generated. However, in some alternate embodiments, the logic controller 142 can also control the current source 140 so that variable amounts of current are generated by the current source 140 depending upon operational circumstances or otherwise varying with time (or the current level can be throttled). In some embodiments, the logic controller 142 can be a microprocessor or alternatively can be made up of other types of logic circuitry such as one or more programmable logic devices (PLDs).

The system 100 in the present embodiment is configured to determine the status (again, the open or closed status) of the switch 102 on an intermittent basis—that is, the system 100 is configured to poll the status of the switch 102 on a periodic or repeated basis. Generally speaking, the system 100 operates in a manner represented by a timing diagram 154 shown in FIG. 4 (which is discussed in further detail below) in which, at recurring polling times 156, the system 100 (and particularly the logic controller 142 thereof) is awakened. Further, on many such occasions when the system is awakened, the current source 140 is activated and current is driven from the current source to or toward the switch 102 for time periods not exceeding a predetermined time period. Additionally, at all other times the current source 140 is inactive such that no current (or virtually no current) is driven to or toward the switch 102. Depending upon whether the switch 102 is open or closed, the voltage experienced at the non-inverting (input) terminal 130 of the comparator 128 can take on different values in response to the driving of the current from the current source 140, and correspondingly the comparator 128 will output signals via the output terminal 134 to the logic controller 142 that are reflective of the switch status.

More particularly, at times when die switch 102 is closed, the output terminal 104 of the system 100 is connected directly to ground (that is, to the terminal 106). When this is the case, the capacitor 120 is fully discharged such that the voltage across the capacitor is zero (or substantially zero) volts. As a result, at polling times when the current source 140 is commanded by the logic controller 142 to drive current, that current flows through the resistor 116, through the output terminal 104, and through the switch 102 to the terminal 106. When this occurs, due to the small resistance associated with the resistor 116, the non-inverting terminal 130 of the comparator 128 experiences a low voltage (or possibly even a voltage equaling or substantially equaling zero) that is less than the threshold voltage that is applied to the inverting terminal 132 by the threshold voltage block 136. Consequently the comparator 128 at such polling times provides an output signal (e.g., a low or zero voltage signal) to the logic controller 142 via the output terminal 134 that indicates that the switch 102 has a closed status. Alternatively, there can be polling times when the switch 102 is open and the capacitor 120 maintains a voltage at the output terminal 104 that is high by comparison with the threshold voltage applied to the inverting terminal 132 of the comparator 128, where the capacitor maintains the relatively high voltage due to the capacitor having been previously charged and not since discharged. At such polling times and in such circumstances, the comparator 128 provides an output signal (e.g., a high voltage signal or voltage signal having a value of one) via the output terminal 134 to the logic controller 142 that indicates that the switch 102 has an open status.

Although the above-described determinations of the status of the switch 102 as being open or closed are straightforward and can be made instantaneously, a complication exists in circumstances where the switch 102 has an open status but the capacitor 120 is not yet charged substantially or at all (e.g., due to discharging of the capacitor via the leakage resistance 126), such that there is little or no voltage differential across the capacitor between the output terminal 104 and the terminal 122 corresponding to ground. In such a circumstance, at polling times when the current source 140 first begins to drive current, even though the switch 102 is open, the voltage applied to the non-inverting terminal 130 of the comparator 128 will be at a low (or possibly even zero) voltage level that is less than any voltage applied to the inverting terminal 132. Under such circumstances, the comparator 128 provides an output signal at the output terminal 134 to the logic controller 142 that incorrectly indicates that the switch has a closed status (e.g., a low or zero voltage signal) even though the switch actually has an open status, and continues to do so even while the current source 140 continues to drive current until such time as the capacitor 120 becomes adequately charged that the voltage across the capacitor between the output terminal 104 and the terminal 122 becomes sufficient so that the voltage at the non-inverting terminal 130 of the comparator 128 exceeds the voltage at the inverting terminal 132.

In order to address this concern, it would be possible to operate the system 100 so that, at each polling time, the current source 140 generated current for a fixed period of time that was sufficient under all circumstances and embodiments to achieve sufficient charging of the capacitor 120 so as to result in a voltage being applied to the non-inverting terminal 130 of comparator 128 that exceeded the voltage applied to the inverting terminal 132 at least by the end of that fixed period of time. However, such a solution is undesirable because it can result in excessive power loss and possible undesirable battery depletion. For example, in some embodiments or circumstances, any of a variety of different capacitors can be employed as the capacitor 120 such that the charging time required in order to charge the capacitor 120 so as to achieve a voltage exceeding the threshold is applied to the inverting terminal 132 can vary considerably. In such embodiments or circumstances, in order to allow for proper status detection and account for the possibility of these different capacitors being employed, the fixed period of time for actuation of the current source 140 can become excessively long and result in ongoing driving of current long after such current is needed to charge up the capacitor, which in turn results in excessive power loss and possible undesirable battery depletion.

Figure 3:
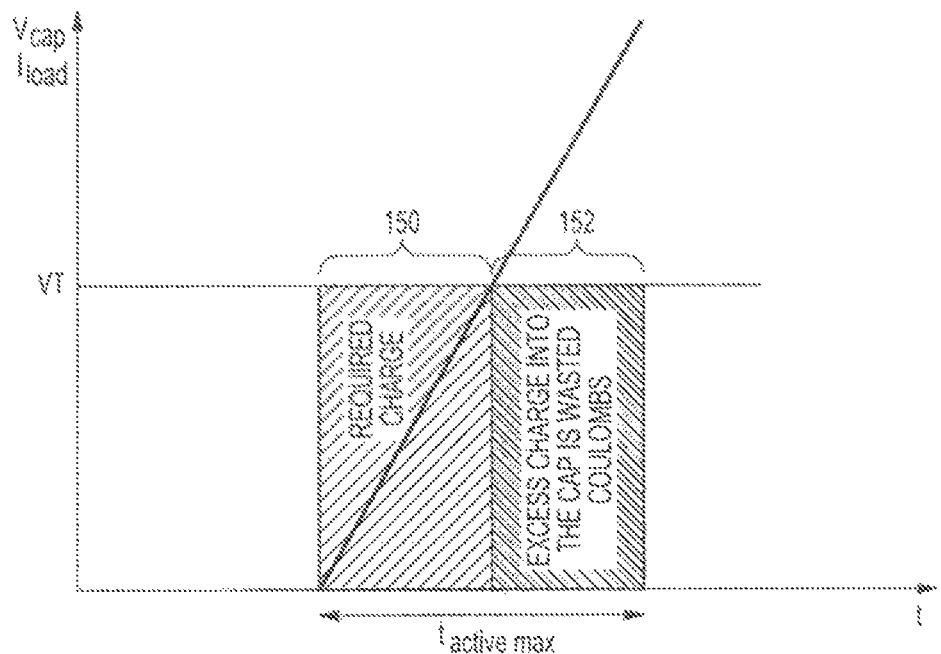
FIG. 3 is a graph illustrating example charging of a capacitor of the switch status detection system of FIG. 1.

Such excessive current actuation is illustrated, further for example, by FIG. 3. There it can be seen that, in one circumstance in which a particular capacitor is employed as the capacitor 120 and the switch 102 has an open status, current need only be driven by the current source 140 for a first period of time 150 in order for a charge Q on the capacitor to increase from zero to a sufficient level whereby the voltage across the capacitor 120 correspondingly rises from zero to a voltage exceeding a threshold voltage VT (where Q represents charge in Coulombs, and Q is equal to the capacitance of the capacitor C multiplied by the voltage across the capacitor V). That is, current need only be driven for the first period of time 150 in order for the voltage across the capacitor 120 to rise from zero to a level exceeding the voltage (VT) applied to the inverting terminal 132 of the comparator 134 such that the comparator 128 is triggered to indicate the open status of the switch 102 (in this example, it is assumed that the voltage at the output terminal 104 as determined by the charging of the capacitor is essentially equal to the voltage applied to the non-inverting terminal 130 of the comparator, due to the low resistance value of the resistor 116 and/or the low level of current flowing through the resistor). Given this to be the case, to the extent current is driven by the current source 140 for additional time beyond the first period of time 150, such as over a secondary period of time 152, this action results in excess charging of the capacitor that is not necessary in order to allow the system 100 to detect the open status of the switch 102 and therefore constitutes unnecessary power consumption. That is, additional current is wasted by powering the current source 140 (e.g., by way of the logic controller 142) longer than necessary.

Figure 2:
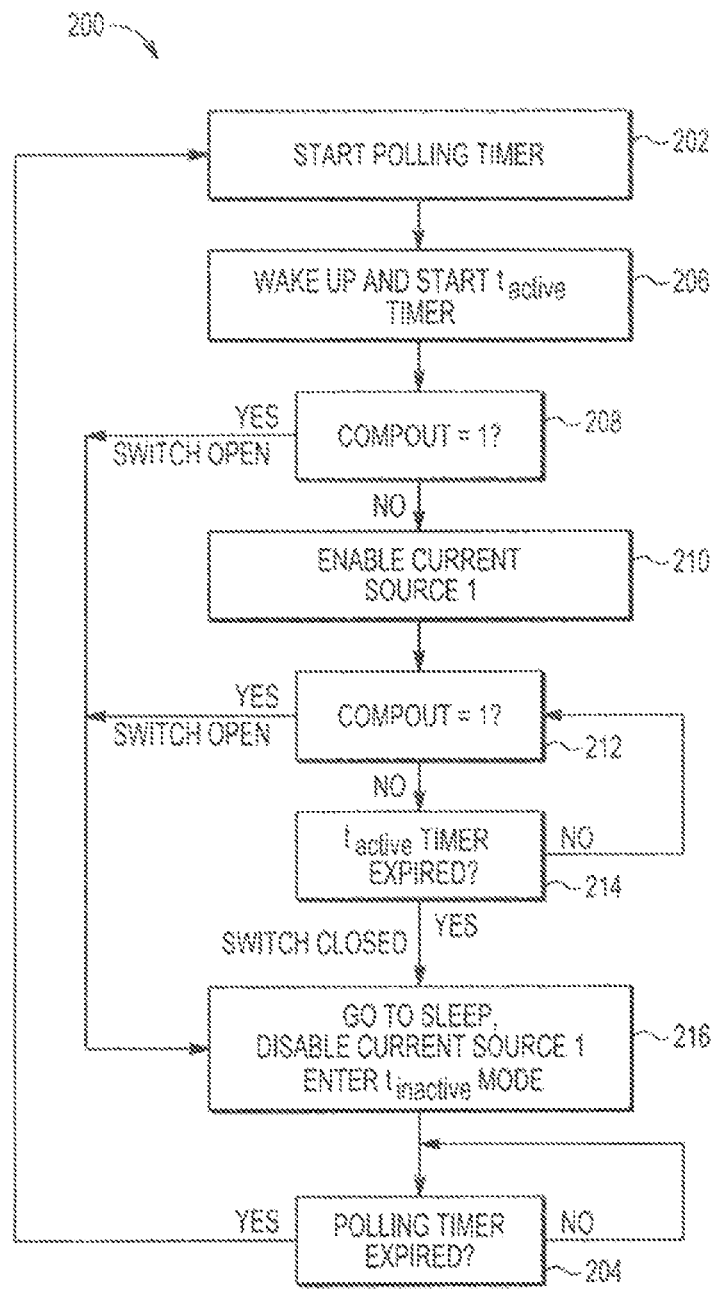
FIG. 2 is a flow chart illustrating an example method of operation of the switch status detection system of FIG. 1.

In order to avoid such excessive and unnecessary current flow, capacitor charging, and power usage and possible battery depletion, in the present embodiment the system 100 and particularly the logic controller 142 thereof operates in accordance with a process represented by a flowchart 200 shown in FIG. 2 (e.g., as controlled by the logic of the logic controller 142). As shown, the process of the flowchart 200 begins with a step 202 at which a polling timer of the logic controller 142 is started. Immediately after (or at the same time or substantially the same time as) the polling timer has been started, then the logic controller wakes up (or enters an "on" mode of operation) at a step 206, that is, the logic controller 142 becomes operational in a manner such that it is observing the output signals from the comparator 128 provided by way of the output terminal 134 thereof, and making control decisions based thereon. Additionally at the step 206, at the time of waking up, the logic controller 142 starts operation of a "$t_{active}$ timer", the purpose of which will be further described below. The waking up of the logic controller 142 can also be referred to as the entry of the logic controller into a "$t_{active}$" mode of operation. Next, at a step 208 that occurs immediately after (or substantially at the same time as) the step 206, the logic controller 142 determines whether or not the output signal provided by the comparator 128 is already indicative of the switch 102 having an open status (e.g., whether the output signal has a high value). As already discussed above, this can occur particularly if the switch 102 has an open status and additionally the capacitor 120 happens to already be in a charged state such that the voltage applied to the non-inverting terminal 130 of comparator 128 exceeds the voltage applied to the inverting terminal 132.

If at the step 208 the logic controller 142 determines that switch has an open status, then process proceeds to a step 216 at which the logic controller goes to sleep, that is, the logic controller enters a low power or "off" mode of operation that can be referred to herein also as a "$t_{active}$" mode of operation. When this occurs, the logic controller 142 causes the timer operation to be discontinued. Then additionally at a step 204 the logic controller 142 (notwithstanding being asleep) determines whether the polling timer started at the step 200 has expired, and remains at (repeats) the step 204 until such time as the polling timer has expired. Once the polling timer has expired, then the process returns to the step 202 at which the polling timer is restarted and the process begins again. Alternatively, however, if at the step 208 the logic controller 142 does not determine that the comparator 128 is providing via the output terminal 134 an output signal indicative of the switch 102 having an open status (hut rather determines that the output signal currently indicates a closed status for the switch), then the process instead advances from the step 208 to a step 210 rather than advancing to the step 216. At the step 210, the logic controller 142 switches on or enables the current source 140 so that the current source drives current and the process immediately advances to a step 212. It should be appreciated that, in this operational scenario, not only do the steps 202, 206, and 208 occur immediately one after another (or all at substantially the same time), but rather all of the steps 202, 206, 208, 210, and 212 occur immediately one after another (or all at substantially the same time).

Upon reaching the step 212 from the step 210, then at the step 212 the logic controller 142 again considers whether the output signal being received from the output terminal 134 of the comparator 128 is indicative of the switch 102 having an open status or a closed status. If at the step 212 the logic controller 142 determines that the output signal received from the output terminal 134 of the comparator 128 is indicative of the switch 102 having a closed status (e.g., because the output signal has a low or zero value), then the process advances from the step 212 to a step 214, at which the logic controller 142 determines whether the $t_{active}$ timer has reached a maximum amount of $t_{active}$ mode time and therefore has expired. So long as the $t_{active}$ timer has not yet expired, then the process returns from the step 214 back to the step 212 and accordingly the logic controller 142 again determines whether the output signal from the comparator 128 is indicative of the switch 102 having an open or closed status. However, if the logic controller 142 either at the initial performing of the step 214 or at a subsequent performing of the step 214 (following a repeat performing of the step 212 at which it is again determined that the comparator 128 indicates that the switch 102 has a closed status) determines that the $t_{active}$ timer has expired, then the logic controller 142 reaches a definitive determination that the switch 102 is closed and so the process proceeds successively to the step 216, to the step 204, and ultimately (upon expiration of the polling timer) to the step 202 as described above.

Alternatively, if the logic controller 142 either at the initial performing of the step 212 or at a subsequent performing of that step (following a determination at the step 214 that the $t_{active}$ timer has not yet expired) determines that the output signal received from the output terminal 134 of the comparator 128 is indicative of the switch 102 having an open status (e.g., because the output signal has a high value), then the logic controller reaches a determination that the switch 102 has an open status. Upon making this determination, the process again advances to the step 216, followed by the step 204, and ultimately the step 202. As illustrated in FIG. 2, when the step 216 is reached either following the performance of the step 212 or the step 214, then in these circumstances the step 216 further includes disabling of the operation of the current source 140 that had been enabled at the step 210, so that current is no longer generated by the current source (by contrast, if the step 216 is reached directly from the step 208, then there is no need to disable the current source since it such case it would not have been enabled). Therefore, particularly by virtue of the steps 210, 212, and 214, it should be appreciated that the logic controller 142 continues to actuate the current source 140 for up to a maximum predetermined amount of time established by operation of the $t_{active}$ timer in order to provide sufficient time for the capacitor 120 to become charged adequately so as to cause the comparator 128 to output a signal indicating that the switch 102 has an open status in circumstances where the switch truly has an open status. If, despite the passage of this maximum predetermined amount of time established by operation of the $t_{active}$ timer, the comparator 128 still does not output a signal indicating that the switch 102 has an open status, then the logic controller 142 treats that as an indication that the switch truly has a closed status. However, also by virtue of the steps 210, 212, and 214, the logic controller 142 immediately ceases to actuate the current source 140 as soon as the capacitor 120 has become adequately charged so as to cause the comparator 128 to output a signal indicating that the switch has an open status.

For the above process to operate properly, the maximum predetermined amount of time established by operation of the $t_{active}$ timer is set just long enough so that, during that amount of time, the current source 140 can succeed in sufficiently charging any capacitor that foreseeably may be implemented as the capacitor 120 such that the voltage appearing at the non-inverting terminal 130 will exceed the voltage at the inverting terminal 132. Consequently, in some embodiments or circumstances, in order to accommodate a wide variety of capacitors being potentially selected for use as the capacitor 120, the maximum predetermined amount of time established by operation of the $t_{active}$ timer can be relatively long. Nevertheless, even with respect to such embodiments or circumstances, the system 100 operating according the process of the flow chart 200 substantially avoids excessive current generation. That is, even with respect to such embodiments or circumstances, the current source 140 only continues to generate current for the entire extent of the maximum predetermined amount of time established by operation of the $t_{active}$ timer if the switch 102 truly has a closed status, but immediately switches off the current source 140 as soon as the logic controller receives any indication from the output terminal 134 of the comparator 128 that the switch 102 has an open status, so as to avoid excessive current generation.

Figure 4:
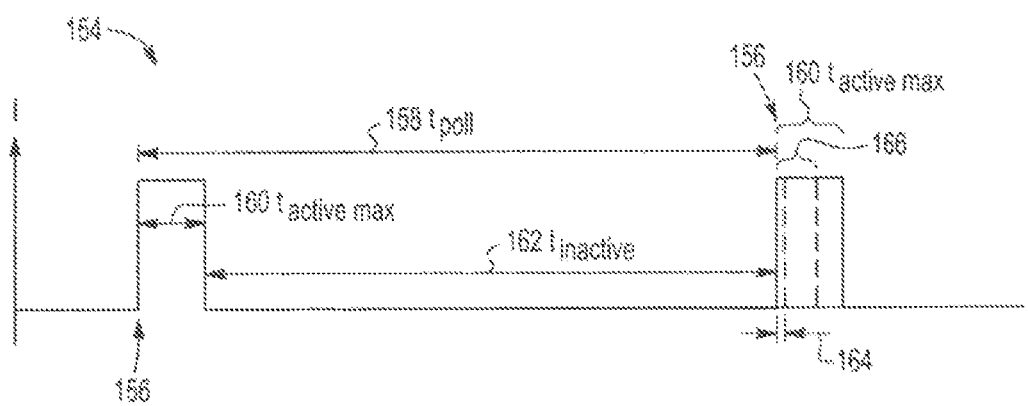
FIG. 4 is a timing diagram illustrating example operation of the switch status detection system of claim 1 in accordance with the method of operation of FIG. 2.

Referring now again to FIG. 4, the timing diagram 154 further illustrates operation of the system 100 in accordance with process represented by the flow chart 200. FIG. 4 particularly illustrates example times at which the system 100 (and particularly the logic controller 142 thereof) is awake and asleep. As can be seen, the system 100 particularly is awakened at the times 156, which correspond to the repeated performing of the step 206 at or immediately following the performing of the step 202. The time period 158 extending between successive ones of the time 156 constitutes the polling time period $t_{poll}$ established by the polling timer, that is, the time period between one performance of the step 202 of the flow chart 200 and a subsequent performance of the step 202 immediately following a performance of the step 204. In at least some embodiments, the polling time period $t_{poll}$ can be, for example, 32 milliseconds. The pulses 160 represent the maximum predetermined amounts of time $t_{activemax}$ that the current source 140 can be enabled and operating in the $t_{active}$ mode (and which also constitute the maximum predetermined amounts of time that the system 100 can be awake during any polling time period), as established by the $t_{active}$ timer. Further, the time period 162 is one example of a period of time $t_{inactive}$ during which the system 100 is asleep, corresponding to the time between a performance of the step 216 of the flow chart 200 and the soonest time thereafter that the step 206 of the flow chart 200 is performed.

Finally, the timing diagram 154 also illustrates by way of additional pulses 164 and 166 encompassed by one of the pulses 160 that, depending upon the particular operational circumstance, the amounts of time that the system 100 is actually awake ($t_{active}$) can be less than the maximum predetermined amount of time $t_{activemax}$ (again as represented by the pulses 160) that the current source 140 can be enabled. This can occur particularly when, for example, the current source is enabled at the step 210 and then subsequently at a performing of the step 212 the logic controller 142 determines that the switch 102 has an open status prior to the expiration of the $t_{active}$ timer. Thus, each of the additional pulses 164 and 166 particularly illustrate circumstances in which the switch 102 is open when the system 100 begins polling the status of the switch, and in which the current source 140 is only actuated to generate current for sufficient times (shorter in the case of the time period 164, longer in the case of time period 166) necessary for the capacitor 120 to become sufficiently charged that the voltage applied at the non-inverting terminal 130 exceeds the voltage at the inverting terminal 132. Such a circumstance is also illustrated by FIG. 3, in which the first period of time 150 is an example amount of time for actuating the current source that is adequate for sufficiently charging the capacitor, such that therefore the current source need not be additionally actuated for the secondary period of time 152, that is, such that the current source need not be actuated for the entire sum of both of the periods of time 150 and 152 that together correspond to the maximum predetermined amount of time $t_{activemax}$. Because the lengths of the times $t_{active}$ at which the current source 140 is actuated during any given polling period $t_{poll}$ can vary, the lengths of times $t_{inactive}$ that the system is asleep also correspondingly (inversely) vary. Relatedly, it should be appreciated that the current source 140 is never actually actuated to generate any current in the instance where the system 100 determines that the switch 102 is open-circuited immediately upon being polled.

Given this manner of operation of the system 100 in accordance with the process of the flow chart 200 and as illustrated by the timing diagram 154, it should be apparent that embodiments such as these can avoid excessive current drain and associated power usage or depletion of power from a power source such as an automobile battery. Indeed, it should be appreciated that in at least some embodiments the total current drain $I_{q,total}$ on a car battery can be represented by the following equation:

$$I_{q,total}(I_q)(t_{poll}-t_{active})/t_{poll}+(I_{core})(t_{active}/t_{poll})+n*Iload \quad (1)$$

In equation (1), $t_{poll}$ is the polling period determining how often the system/logic controller 142 (e.g., the integrated circuit forming the logic controller) awakens to check switch states, and $t_{active}$ is the amount of time during a given polling period that the current source (e.g., the current source 140) is conducting current. Additionally, in this equation (1), $I_q$ is the quiescent current of the system (e.g., the quiescent current of the logic controller 142 or integrated circuit forming that logic controller, and/or the current source) while asleep and thus in a low power mode of operation (e.g., when in the "$t_{inactive}$" mode of operation as described above), and $I_{core}$ is the current consumed by core circuits such as regulators (e.g., BG/band gap related and otherwise). Further, in this equation (1), Iload is the current delivered from the system/current source 140 (e.g., the load capacitor 120) when polling switches (e.g., when in the "$t_{active}$" mode of operation as described above), and n is the number of channels actually polled—in the system 100 of FIG. 1, there is only a single channel, but in alternate embodiments, there can be multiple channels.

In view of equation (1), it should be evident that the total current drain $I_{q,total}$ generally is lessened to the extent that $t_{active}$ is reduced. Therefore, although the present embodiment allows for current generation during each given polling period $t_{poll}$ for as much as the maximum amount of time $t_{activemax}$ established by the $t_{active}$ timer, current generation often does not continue that long. Rather, the logic controller 142 switches off the current source 140 as soon as it is determined prior to the expiration of that maximum amount of time $t_{activemax}$ that the switch has an open status. Thus, the present system serves to avoid excessive current drain and associated power depletion that would otherwise occur if instead the current source 140 continued to drive current until the full expiration of that maximum amount of time $t_{activemax}$.

Additionally from the above discussion, it should be appreciated that one or more embodiments encompassed by the present disclosure can have one or more advantages. For example, in at least some embodiments, the present disclosure encompasses a circuit having a two-stage current and operational methodology to differentiate between an open switch and a closed switch independent of the external capacitance across the switch. In at least some such embodiments, a charging current is employed to rapidly charge the capacitor the detection threshold, and to thereby only use the optimal charge (Q=C*V) to reach the threshold, and to minimize current drain of support circuits by powering the circuits for only the time required. Also, in at least some embodiments, a holding current less than the charging current can be employed to minimize load current drain on a battery or other power source and to eliminate capacitor leak down and charge the external capacitor beyond threshold for noise immunity.

It should be appreciated that embodiments of the present invention are intended to encompass not only the embodiments described above and/or shown in FIGS. 1, 2, 3, and 4, but also are intended to encompass numerous other embodiments as well. For example, in alternate embodiments, the time periods established by the polling timer and/or the $t_{active}$ (or testing) timer can vary depending upon the operational circumstance and need not always be constant throughout operation of the system. Further for example, in some embodiments, the maximum predetermined amounts of time established by the $t_{active}$ (or testing) timer can vary based upon information concerning the capacitor that is implemented as the capacitor 120. Also, the present disclosure is intended to encompass a variety of other circuits and systems having different components than, or further components in addition to, those described above. For example, in at least some embodiments, a deglitch filter can be employed to further ensure accurate detection of the status of the switch.

Further, the present disclosure is not intended to be restricted to sensing the status of switches that are connected directly to ground, but rather is intended to also encompass embodiments in which the switch is coupled in a different manner rather than to ground or directly to ground. For example, in at least some other embodiments of the system 100, the system is configured to sense the status of a switch that is coupled to another voltage such as a voltage provided by a battery, rather than being coupled to ground as in FIG.

Figure 5:
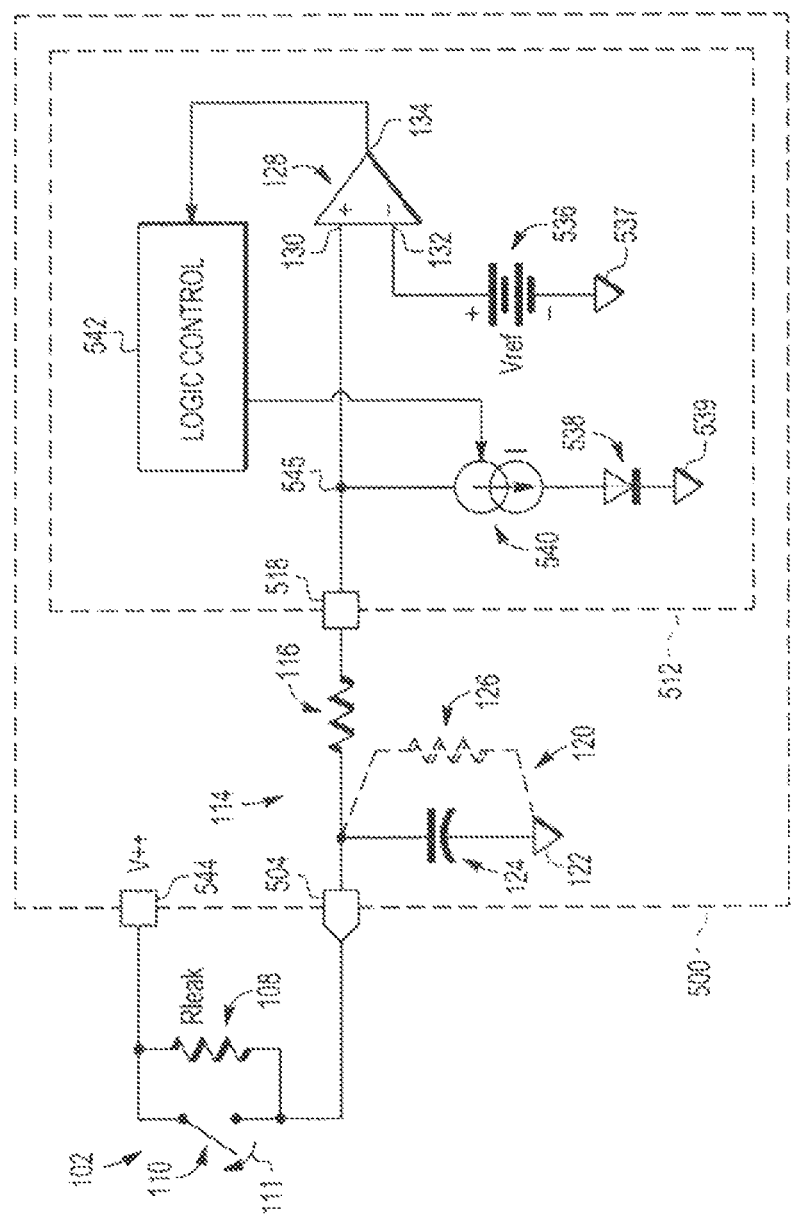
FIG. 5 is a schematic diagram illustrating example components of a switch status detection system in accordance with an embodiment of the present disclosure.

1. Such an embodiment is shown in FIG. 5, which shows a system 500 that, similar to the system 100, is configured to determine the status (again, the open or closed status) of the switch 102 on an intermittent basis—that is, the system 100 is configured to poll the status of the switch 102 on a periodic or repeated basis. As shown, the system 500 is similar to the system 100 insofar as the system 500 includes the comparator 128 with the non-inverting and inverting terminals 130 and 132 and the output terminal 134 and also includes the additional circuitry 114 including the resistor 116 and the capacitor 120 coupled between that resistor and ground (the terminal 122). Also as with the system 100, a node linking the resistor 116 and capacitor 120 also is directly coupled to (short-circuited to or electrically the same node as) an output terminal of the system 500 to which the switch 102 is coupled, which is shown as an output terminal 504. However, the system 500 differs from the system 100 in that the system 500 in this embodiment is configured to allow for sensing of the status of the switch 102 even though the switch, rather than being coupled between an output terminal of the system and ground (as was the case in the arrangement of FIG. 1), is instead coupled between an output terminal 504 of the system 500 and a voltage supply (V++) terminal 544. Relatedly, in this embodiment, the comparator 128 is part of a switch to battery (SB) circuit 512 (instead of a SG circuit such as the SG circuit 112 of FIG. 1).

To allow for such operation, the system 500 particularly has several additional features. First, the non-inverting terminal 130 of the comparator 128 is coupled to a node 545 to which is coupled a current source 540 and, in contrast to the embodiment of FIG. 1, the current source 540 directs current to flow away from the node 545 toward a diode 538 that is coupled between the current source and a ground terminal 539. The anode of the diode 538 is coupled to the current source 540 and the cathode of the diode is coupled to the ground terminal 539, and thus the current source 540 tends to direct current from the node 545 to ground. The node 545 is electrically the same node as, and is shown to be linked between, the non-inverting terminal 128 and an output terminal 118 of the SB circuit 512, with the resistor 116 in turn being coupled between the output terminal 118 and the output terminal 504 of the system 500. Further, a logic controller 542 is coupled to, and receives signals from, the output terminal 134 of the comparator 128 and also is coupled to the current source 540 and is configured to control the switching on and off of the current source 540 (and/or the amount of current generated by the current source). The inverting terminal 132 of the comparator 128 is coupled to a battery 536 that in turn is coupled to a ground terminal 537. Although FIG. 5 shows the battery 536 particularly as being present in the system 100 to apply a voltage threshold to the inverting terminal 132, it should be appreciated that in other embodiments any of a variety of other devices that can apply a voltage threshold to the inverting terminal 132 can be employed in place of the battery including, for example, any of the components or devices discussed above as being encompassed by the voltage threshold block 136 of FIG. 1.

It should be appreciated that the system 500 in the present embodiment operates in a manner that is analogous to the manner of operation described above with respect to FIGS. 2-4 in relation to the system 100, except that certain operational aspects that are substantially inverted due to the switch 102 being coupled to the voltage source terminal 544 rather than to ground. Again, as with the system 100, depending upon whether the switch 102 is open or closed, the voltage experienced at the non-inverting (input) terminal 130 of the comparator 128 can take on different values in response to the driving of the current from the current source 540, and correspondingly the comparator 128 will output signals via the output terminal 134 to the logic controller 542 that are reflective of the switch status. More particularly, at times when the switch 102 is closed, the output terminal 504 of the system 100 is connected directly to V++ (that is, to the voltage source terminal 544). When this is the case, the capacitor 120 is fully charged such that the voltage across the capacitor is equal to the supply voltage (V++ volts) at the voltage source terminal 544. As a result, at polling times when the current source 540 is commanded by the logic controller 542 to drive current, that current flows from the voltage source terminal 544 through the switch 102, through the output terminal 504 (which due to the direction of current flow can in this case therefore also be considered to constitute an input terminal), through the resistor 116, through the current source 540, through the diode 538, and to ground (the ground terminal 539). When this occurs, due to the small resistance associated with the resistor 116, the non-inverting terminal 130 of the comparator 128 experiences a high voltage (or possibly even a voltage equaling or substantially equaling V++) that is higher than the threshold voltage that is applied to the inverting terminal 132 by the battery 536. Consequently the comparator 128 at such polling times provides an output signal (e.g., a high voltage signal or voltage signal having a value of one) to the logic controller 542 via the output terminal 134 that indicates that the switch 102 has a closed status.

Alternatively, at polling times when the switch 102 is open and the capacitor 120 (due to previously-being discharged and not since being charged) maintains a voltage at the output terminal 104 that is zero or low by comparison with the threshold voltage applied to the inverting terminal 132 of the comparator 128, then in such circumstances the comparator 128 provides an output signal (e.g., a zero or low voltage signal) via the output terminal 134 to the logic controller 542 that indicates that the switch 102 has an open status. Additionally, in circumstances where the switch 102 has an open status but the capacitor 120 has not yet been discharged substantially or at all (e.g., due to charging of the capacitor via the leakage resistance 108), then at polling times when the current source 540 first begins to drive current, even though the switch 102 is open, the voltage applied to the non-inverting terminal 130 of the comparator 128 will be at a high (possibly even V++) voltage level that is higher than any voltage applied to the inverting terminal 132. Under such circumstances, the comparator 128 provides an output signal at the output terminal 134 to the logic controller 542 that incorrectly indicates that the switch has a closed status (e.g., a high or one voltage signal) even though the switch actually has an open status, and continues to do so even while the current source 540 continues to drive current until such time as the capacitor 120 becomes adequately discharged that the voltage across the capacitor between the node 545 (and output terminal 504) and the terminal 122 becomes sufficient so that the voltage at the non-inverting terminal 130 of the comparator 128 becomes less than the voltage at the inverting terminal 132.

Given the embodiment of FIG. 5 with the above-described features, it should be appreciated that the system 500 (and particularly the logic controller 542) can be operated in a manner that is substantially the same as the process shown in FIG. 2, except insofar as certain aspects are inverted. That is, as described with respect to FIG. 2, operation of the system 500 (and particularly the logic controller 542) can include all of the steps 202, 204, 206, 208, 210, 212, 214, and 216 of the flow chart 200. Each of these steps can be exactly the same except that, instead of the logic controller 542 determining whether the output signal from the comparator 128 is at a high (e.g., one) value at the steps 208 and 212, instead the processor will determine whether the output signal from the comparator 128 is at a low (e.g., zero) value at those steps. Thus, if upon reaching the step 208 the switch is open-circuited and the voltage across the capacitor 120 is sufficiently low that the voltage at the non-inverting terminal 130 is below the threshold voltage applied at the inverting terminal 132, then the output signal received by the logic controller 542 is also low and the process accordingly advances to the step 216 because the system 500 has accurately determined that the switch is open-circuited. Alternatively, if upon reaching the step 208 the voltage across the capacitor 120 is sufficiently high that the voltage at the non-inverting terminal 130 exceeds the threshold voltage applied at the inverting terminal 132, then the output signal received by the logic controller 542 will be high and the process will advance through the step 210 and 212.

Subsequently, upon reaching the step 212, if the voltage across the capacitor 120 has by that time dropped sufficiently (e.g., because of discharging of the capacitor 120 due to operation of the current source 540) that the voltage applied to the non-inverting terminal 130 is less than the threshold voltage applied to the inverting terminal 132, then the output signal provided from the comparator 128 to the logic controller 542 by that time will have switched to a low (e.g., zero) value. In this case, the process would advance from the step 212 to the step 216, which would be proper insofar as again the low output signal provided from the comparator 128 would be accurately indicating that the switch 10 is open-circuited. Alternatively, if upon reaching the step 212 the voltage across the capacitor 120 at that time continues to be at a higher level than the threshold voltage applied to the inverting terminal 132, then the output signal received by the logic controller 542 continues to be at a high (e.g., one) value and accordingly the process advances to the step 214. In this circumstance, the process then continues to cycle through the steps 212 and 214 either until the logic controller 542 at the step 212 detects that the output signal from the comparator 128 has taken on a low level indicating (as already discussed above) that the switch is open-circuited, or until the "$t_{active}$ timer" is determined to have expired at the step 214, in which case the system 500 concludes that the switch 102 is closed and the process advances to the step 216.

Thus, the process of FIG. 2 is substantially equally applicable to the system 500 of FIG. 5 as it is with respect to the system 100 of FIG. 1, except insofar as the high/low determinations by the logic controller 542 at the steps 208 and 212 are reversed. Similar to the process of FIG. 2 when performed by the system 100 of FIG. 1, the process of FIG. 2 when performed by the system 500 (as modified for the system 500 as discussed above) particularly is advantageous in that it avoids unnecessarily-lengthy actuation of the current source 540 in circumstances where the switch 102 is open-circuited but a high voltage exists across the capacitor 120 when testing of the status of the switch first begins. Rather, in accordance with this process, the logic controller 542 switches off the current source 540 as soon as the capacitor 120 discharges sufficiently that the voltage applied to the non-inverting terminal 130 decreases below the threshold voltage applied to the inverting terminal 132, at a time prior to the expiration of the $t_{active}$ timer, rather than continuing to actuate the current source until the that timer has expired (and the time $t_{active}$ has elapsed).

Further with respect to FIG. 5, it should be appreciated that, notwithstanding the above description, the present disclosure is intended to encompass a variety of modified embodiments of the system 500. For example, although a number of the components of the system 500 are shown to be components that are different from those the system 100, in other embodiments one or more of those components can be identical or substantially the same as those of the system 100. For example, in some embodiments, the logic controller 542 can be identical in structure to the logic controller 142 of FIG. 1 (aside from possibly being programmed differently, for example, to take into account the differences in the process of FIG. 2 that are pertinent to operation of the system 500 as described above). Also, it should be appreciated that the timers (e.g., the "$t_{active}$ timer" and the polling timer) operating as part of the process of FIG. 2 can be set to determine the elapsing of different amounts of time depending upon whether the system performing the process is a system such as the system 500 of FIG. 5 involving a switch coupled to the supply voltage or is a system such as the system 100 of FIG. 1 involving a switch coupled to ground.

Notwithstanding the above discussion concerning how the processes of operation of both of the systems 100 and 500 of FIGS. 1 and 5 can follow substantially the same process as shown in FIG. 2 (albeit with some changes as also described above), it should be appreciated that the system 500 having the switch 102 coupled to the supply voltage has certain disadvantages by comparison with the system 100 having the switch 102 coupled to ground. In particular, despite the presence of the logic controller 542 and despite operation according to a process as described above in which unnecessarily lengthy actuation of the current source 540 is avoided, the operation of the system 500 still involves higher current generation by the current source and concomitant power dissipation than is the case with operation of the system 100. More particularly in this regard, it should be appreciated that the threshold voltage applied to the inverting terminal 132 by the battery 536 in the system 500 is typically the same as the threshold voltage applied to the inverting terminal 132 by the voltage threshold block 136 in the system 100, and that these threshold voltages tend to be set at a small fraction of the supply voltage (V++) existing at the voltage source terminals 144, 544 (assuming, for comparison purposes, that the supply voltage is the same for both of the systems 100, 500). For example, in some example embodiments, if the supply voltage (V++) at the voltage source terminals 144, 544 is 12 Volts, then the threshold voltage applied to the inverting terminal 132 by the voltage threshold block 136 and battery 536 can be 2 Volts.

Given this to be the case, it should be appreciated that the length of time that the current source 540 typically will have to be actuated in order to discharge the capacitor 120 so that the voltage applied to the non-inverting terminal 130 falls below the threshold voltage (again, in this case, 2 Volts) applied to the inverting terminal 132, in a circumstance where the switch 102 is open-circuited but the capacitor starts at a voltage equaling or substantially equaling the supply voltage (in this case, 12 Volts), will greatly exceed the length of time that the current source 140 typically will have to be actuated in order to charge the capacitor 120 so that the voltage applied to the non-inverting terminal 130 exceeds the threshold voltage applied to the inverting terminal 132, in a circumstance where the switch is open-circuited but the capacitor starts at a voltage of zero or substantially equaling zero. In other words, it should be appreciated that the typical lengths of the pulses (e.g., the pulse 166 of FIG. 4) during which the current source 140 of the system 100 will be actuated to charge the capacitor 120 when the switch 102 is open-circuited in the embodiment of FIG. 1 will be much less than the typical lengths of the corresponding pulses during which the current source 540 of the system 500 will be actuated to discharge the capacitor 120 when the switch 102 is open-circuited in the embodiment of FIG. 5.

Additionally, it should also be recognized that the difference in performance between the two systems 100 and 500 in this regard depends upon the level of the supply voltage (V++) at the voltage source terminals 144 and 544 relative to the level of the threshold voltage applied to the inverting terminal 132. As already mentioned, it is typically the case that the threshold voltage applied to the inverting terminal 132 of the comparator 128 will be much less than (e.g., substantially less than half) the supply voltage (V++). Yet a different circumstance exists if, alternatively for example, the threshold voltage happens to be set to a level constituting a high proportion of the supply voltage (e.g., if the threshold voltage is 10 Volts and the supply voltage V++ again is 12 Volts). In such a circumstance, the length of time that the current source 140 typically will have to be actuated in order to charge the capacitor 120 so that the voltage applied to the non-inverting terminal 130 exceeds the threshold voltage applied to the inverting terminal 132 will be much greater than the length of time that the current source 540 typically will be actuated in order to discharge the capacitor 120 so that the voltage applied to the non-inverting terminal falls below the threshold voltage applied to the inverting terminal 132.

Figure 6:
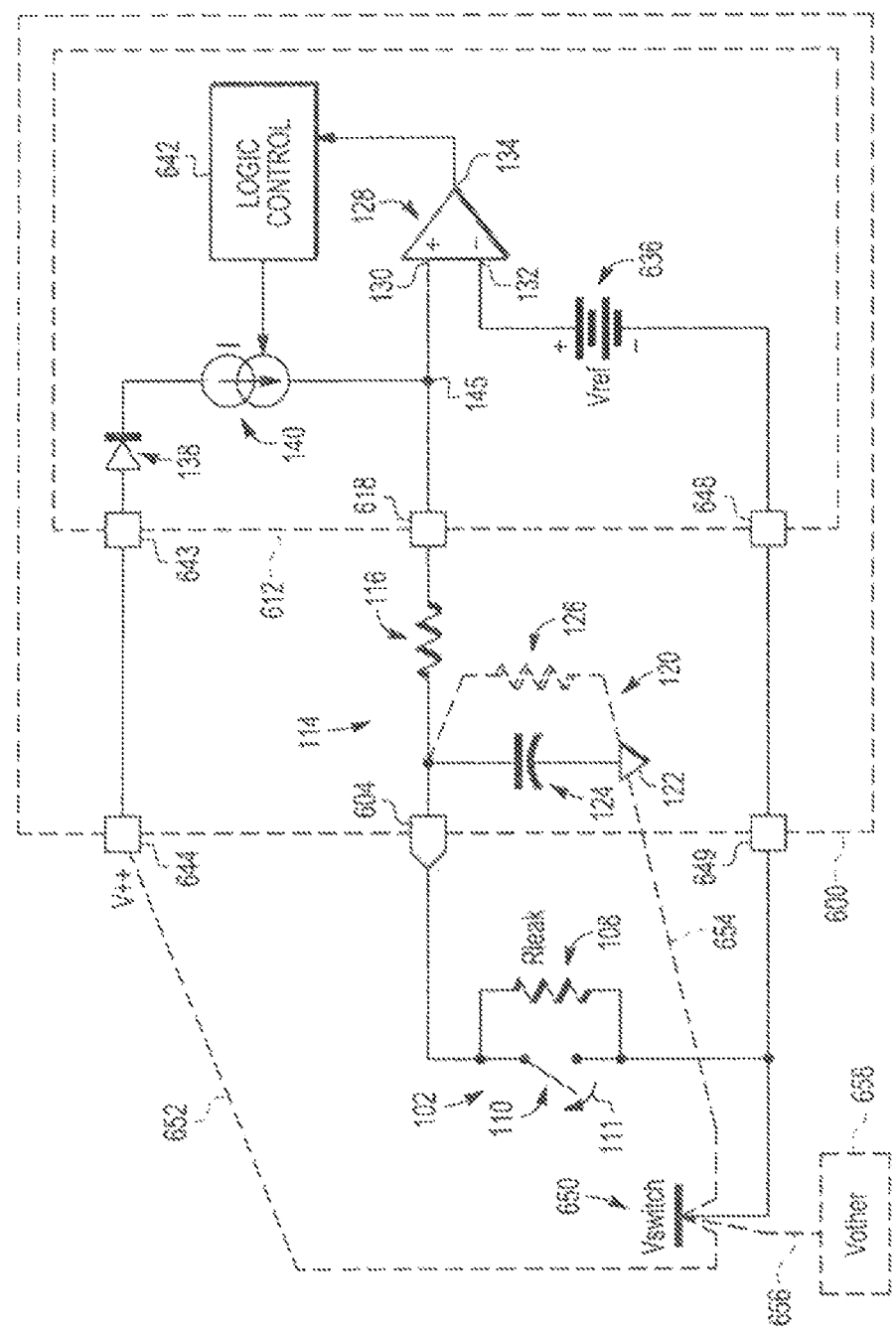
FIG. 6 is a schematic diagram illustrating example components of a switch status detection system in accordance with an embodiment of the present disclosure.

In view of these considerations, turning to FIG. 6, an additional schematic diagram illustrates an additional system 600 encompassed by the present disclosure that not only is configured to detect the status of the switch 102 but also is configured to do so equally effectively (or substantially equally effectively), in terms of avoiding excessive actuation of a current source, regardless of whether the switch is coupled to ground or coupled to the supply voltage (V++) and indeed, more generally, configured to do so equally effectively in a manner that is independent of the voltage to which the switch is connected. In this embodiment, the system 600 (similar to the systems 100 and 500) again is configured to determine the status (again, the open or closed status) of the switch 102 on an intermittent basis—that is, the system 600 is configured to poll the status of the switch 102 on a periodic or repeated basis. Further as shown, the system 600 is similar to the systems 100 and 500 insofar as the system 600 includes the comparator 128 with the non-inverting and inverting terminals 130 and 132 and the output terminal 134 and also includes the additional circuitry 114 including the resistor 116 and the capacitor 120 coupled between that resistor and ground (the terminal 122). As is the case with the embodiments discussed above (e.g., as shown in FIGS. 1 and 5), the capacitor 120 can (in at least some circumstances) serve a purpose of providing electrostatic discharge protection. Additionally as with the systems 100 and 500, a node linking the resistor 116 and capacitor 120 also is directly coupled to (short-circuited to or electrically the same node as) an output terminal of the system 600 to which the switch 102 is coupled, which is shown as an output terminal 604. Further, in the same manner as in the system 100 of FIG. 1 (albeit different from the system 500 of FIG. 5 as discussed above), the diode 138 and current source 140 are coupled in series with one another (in the same manner as shown in FIG. 1) between a voltage supply terminal (having a voltage V++), which in this example is shown as a terminal 644, and the node 145 that is electrically the same node as the non-inverting terminal 130 of the comparator 128.

However, the system 600 differs from the systems 100 and 500 in that the system 600 in this embodiment is configured to allow for sensing of the status of the switch 102 regardless of whether the switch 102 is coupled between the output terminal 604 and ground, between the output terminal 604 and the supply voltage (V++), or between the output terminal 604 and some other node at some other voltage. More particularly as illustrated, in the present embodiment, a battery 636 coupled to the inverting terminal 132 of the comparator 128 is coupled between a terminal 649 of the system 600 and the inverting terminal 132, and further the switch 102 is coupled between the output terminal 604 and the terminal 649. Additionally, the terminal 649 is also directly coupled to (short-circuited to) and thus electrically constitutes the same node as a further $V_{switch}$ terminal 650. The $V_{switch}$ terminal 650 is intended to be representative of a node that can, depending upon the embodiment, implementation, or operational circumstance (e.g., the setting of the status of yet another switch other than the switch 10), be set to any of ground, as represented by a dashed line 652 linking the $V_{switch}$ terminal to the terminal 122, the supply voltage (V++), as represented by a dashed line 654 linking the $V_{switch}$ terminal to the voltage source terminal 644, or to another voltage other than ground and the supply voltage, as represented by a dashed line 656 linking the $V_{switch}$ terminal to a $V_{other}$ box 658.

In addition to the above features of the system 600, it should also be appreciated that the system 600 can be understood to include an internal circuit 612 that, similar to the SG circuit 112 and SB circuit 512, includes the comparator 128, battery 636, current source 140, diode 138, and logic controller 642. Because in this embodiment the switch 102 is not necessarily coupled to any particular voltage, the internal circuit 612 can also be referred to as an "any switch" circuit. Given that the internal circuit 612 is encompassed by the system 600, as illustrated, the voltage source terminal 644 of the system 600 more particularly can be considered to be coupled to the anode of the diode 138 by way of a terminal 643 of the internal circuit, the node 145 can be viewed as being coupled to the resistor 116 by way of a terminal 618 of the internal circuit, and the battery 636 can be viewed as being coupled to the terminal 649 by way of a terminal 648 of the internal circuit 612. Although shown as discrete structures, the terminals 643, 618 and 648 respectively can be merely representative of connection points along linkages connecting the voltage source terminal 644 with the diode 138, the resistor 116 with the node 145, and the terminal 649 with the battery 636.

In view of the above description, it should be appreciated that the voltage applied to the inverting terminal 132 can be considered an "absolute" threshold voltage ($VT_{absolute}$), the voltage existing at the $V_{switch}$ terminal 650 can be considered a switch threshold reference voltage (SwitchRef), and the voltage across the battery 636 can be considered a relative threshold voltage ($VT_{relative}$), where $VT_{absolute}$ equals SwitchRef plus $VT_{relative}$. By virtue of the direct coupling (short-circuiting) of both the battery 636 and the switch 102 to the terminal 649, the system 600 is a system that is capable of determining the status of the switch 102 regardless of the voltage that happens to be applied across the switch relative to the voltage at the output terminal 604 (that is, regardless of the voltage that is applied to the switch terminal that is other than the switch terminal coupled to the output terminal 604). Further, in at least some embodiments, the V$_{switch}$ terminal 650 by itself or in association with one or more other components allows the system 600 to be configurable such that, depending upon the embodiment, implementation, or operational circumstance, the baseline voltage established at the V$_{switch}$ terminal 650 that is applied to each of the switch 102 and the battery 636 can be set to any of a variety of levels and/or varied over time. Notwithstanding such modifications in the circuit configuration, the system 600 nevertheless still continues to be able to determine the open or closed status of the switch 102.

It should additionally be appreciated that the embodiment of FIG. 6 can operate substantially in accordance with the process of FIG. 2 shown in the flow chart 200. Thus, as discussed above in relation to FIGS. 1-2, the system 600 can operate to detect the status of the switch 102 on an intermittent basis without continuing to drive the current source 140 for times longer than are necessary in order to charge the capacitor 120 sufficiently to indicate that the switch 102 is open-circuited when that is in fact the case and charging of the capacitor is necessary to confirm that status. Further, it should also be appreciated that, given the above-described features, the system 600 beneficially constitutes a switch detection topology in which the comparator threshold (threshold voltage applied to the inverting terminal 132) is referenced to the supply (or node) to which the switch 102 is connected, thereby optimizing the current required to charge/discharge load for both high and load side switches and thus minimizing (or at least avoiding excessive) total current drain and associated power dissipation.

Thus, in contrast to the embodiment of FIG. 5 in which undesirably long times of actuation of the current source 540 can be needed in order to discharge the capacitor 120 in circumstances where the voltage difference is significant between the threshold voltage applied to the inverting terminal 132 and the voltage level to which the switch terminal other than the switch terminal coupled to the 504 is set, in the system 600 of FIG. 2 that voltage difference is always set by the battery 636 and can be kept to a modest amount. That is, while in the embodiment of FIG. 5 the value of VT$_{relative}$ can be undesirably high depending upon the implementation, in the embodiment of FIG. 6 the value of VT$_{relative}$ is always the same level as determined by the battery 636, and can be kept to an acceptable level such as 2 Volts.

Although the embodiments described above in relation to FIGS. 1-6 all are embodiments in which a logic controller such as the logic controllers 142, 542, and 642 is present so as to control intermittent sampling operation by way of controlling the actuation of a current source (such as the current sources 140 or 540), embodiments of the present invention are intended to encompass other embodiments as well. For example, the system 600 of FIG. 6 can in some alternate embodiments be implemented without the use of a logic controller 642 and in some such embodiments the actuation of the current source 140 can be controlled in other manners or by other circuits. Indeed, in some embodiments, the output signal(s) of the comparator 128 are used as an indication of the status of the switch but control of the operation of the current source is determined on some other basis as opposed to being based (at least in part) upon the output signals from the comparator. Also, in some embodiments, the current source can actually include a current source component that generates current and also a switching component, where the two components are in series, and whether the overall current source delivers current depends upon the open or closed status of that switching component.

Also, it should be appreciated that the power savings associated with embodiments of the present disclosure need not be limited only to power savings associated with the operation of the logic controller 142, current source 140, or system 100. Rather, in at least some embodiments, power savings is achieved with respect to the operation not only of the logic controller 142, current source 140, or system 100 (e.g., in relation to the testing of the switch 102) but also to other components that can be associated with the system 100 or associated with a larger system or device (e.g., an integrated circuit) of which the system 100 forms a part including, for example, regulators, support circuits (e.g., circuits that support operation of the logic controller 142), and other circuit components. Such power savings can particularly be achieved when the logic controller 142, system 100, and possibly one or more other components of a larger system or device (e.g., an integrated circuit), or even such a larger system or device in its entirety, enter(s) the low-power or "off" mode of operation. Also, the present disclosure is intended to encompass embodiments of systems and circuits that can be implemented in relation to any of a variety of larger systems and/or in any of a variety of applications or environments including, for example, to determine switch statuses in automotive applications (e.g., with respect to door switches, light switches, or other switches in automobiles).

Additionally, in at least some example embodiments encompassed herein, the present invention relates to a system for determining a status of a switch having first and second terminals. The system includes a first port configured to be coupled to the first terminal of the switch, a second port configured to be directly coupled to the second terminal of the switch, so that the second terminal of the switch constitutes a single electrical node, and a capacitor coupled between the first port and ground. The system additionally includes a comparator device having first and second input ports and an output port, where the first input port is coupled at least indirectly to the first port, a current source coupled to the first input port, and a voltage source coupled between the second port and the second input port, where the voltage source is configured to apply a first voltage to the second input port and the first voltage is relative to a second voltage experienced at the second port. The comparator device is configured to provide an output signal at the output port that is indicative of whether the first voltage applied at the second input port is above or below a third voltage received at the first input port, the output signal at least sometimes being indicative of the status of the switch.

Additionally, in at least some such embodiments, the system is configured so that the system can achieve the determining of the status of the switch both in a first implementation in which the second port is grounded and in a second implementation in which the second port is other than grounded. Further, in at least some such embodiments, the determining of the status of the switch can be performed when the second port is grounded or set to a different voltage that is either a supply voltage or a further voltage. Also, in at least some such embodiments, the system further includes an additional terminal that is coupled directly to the second port and directly coupled to the second terminal of the switch, and the additional terminal can be configured in various manners so that the second port is grounded, or set to the supply voltage, or set to the further voltage. Further, in at least some such embodiments, the voltage source is a battery that provides a voltage differential between the first voltage and the second voltage. Additionally, in at least some such embodiments, the system includes the switch and the switch is a single pole, single throw (SPST) switch, and the capacitor is selectable from among a plurality of capacitors that can be coupled between the first port and ground. Also, in at least some such embodiments, the current source includes one or more of a resistor and a current mirror, and the system is implemented in an automotive application.

Further, in at least some such embodiments, the system also includes a resistor that couples the first input port with the first port, and a diode linking the current source to a power source, and the comparator device includes an operational amplifier. Additionally, in at least some such embodiments, the system further includes a control component coupled to the output port and the current source, where the control component is configured to control the current source so that the current source intermittently drives current, where the control component includes one or more of a logic circuit and a microprocessor, and where the control component is configured so that, in at least one operational circumstance, the control component causes the current source to cease driving the current in response to receiving a first indication from the output port indicating that the third voltage applied to the first input port has changed from being less than the first voltage to being greater than the first voltage. Also, in at least some such embodiments, the control component is further configured so that, in at least some additional operational circumstances, the control component refrains from causing the current source to drive any of the current in response to receiving a second indication from the output port indicating that the third voltage applied to the first input port is greater than the first voltage. Further, in at least some such embodiments, the control component is further configured so that, in at least some additional operational circumstances, the control component causes the current source to continue driving the current for a full extent of a predetermined time period in response to receiving a second indication from the output port indicating throughout the predetermined time period that the third voltage applied to the first input port remains less than the first voltage.

Additionally, in at least some example embodiments, the present invention relates to a circuit configured for interacting with a capacitor and a switch in a manner allowing for determining a status of the switch, the switch having first and second terminals and the capacitor having a first node that is directly coupled to the first terminal of the switch. The circuit includes a comparator device having first and second input ports and an output port, where the first input port is configured to be coupled at least indirectly to the first node, a current source coupled to the first input port, and a voltage source coupled between a second node and the second input port and configured to apply a first voltage to the second input port, the first voltage being relative to a second voltage of the second node. The circuit is further configured so that the second node can be directly coupled to the second terminal of the switch so that the second voltage is also experienced by the second terminal, whereby the determining of the status of the switch can be achieved regardless of a level of the second voltage.

Further in at least some such embodiments, the circuit is configured to achieve the determining of the status of the switch when the second voltage is other than grounded. Also, in at least some such embodiments, the circuit further includes a diode linking the current source to a power source, where the comparator device includes an operational amplifier, where the current source includes one or more of a resistor and a current mirror, and where the first input port is coupled to the first node by way of a resistor. Additionally, in at least some such embodiments, the circuit further includes a control component coupled to the output port and the current source, where the control component is configured to control the current source so that the current source intermittently drives current toward the first node. The control component is configured so that, in at least one operational circumstance, the control component causes the current source to cease driving the current toward the first node in response to receiving a first indication from the output port indicating that an additional voltage received at the first input port has changed from being less than the first voltage to being greater than the first voltage. Also, in at least some such embodiments, the control component includes one or more of a logic circuit and a microprocessor, and the control component is further configured so that, in at least some additional operational circumstances, the control component one or both of (i) refrains from causing the current source to drive any of the current in response to receiving a second indication from the output port indicating that the additional voltage applied to the first input port is greater than the threshold voltage, or (ii) causes the current source to continue driving the current for a full extent of a predetermined time period in response to receiving a third indication from the output port indicating throughout the predetermined time period that the additional voltage applied to the first input port is less than the threshold voltage.

Also, in at least some example embodiments, the present invention relates to a method of determining a status of a switch. The method includes coupling a first terminal of the switch to a first port that is coupled to ground by way of a capacitor and also coupled, at least indirectly, to each of current source and a first input port of a comparator. The method also includes coupling a second terminal of the switch to a second port that in turn is coupled to a second input port of the comparator by way of a voltage source that is coupled between the second port and the second input port, where the second terminal is at a first voltage, and generating by way of the voltage source a voltage differential between the first voltage and a second voltage that is applied to the second input port. Further, the method also includes causing the current source to generate a current, receiving a first signal indicating that a third voltage at the first input port of the comparator has switched from being less than the second voltage to being greater than the second voltage and, based at least in part upon the received first signal, attaining a determination that the switch has an open status and causing the current source to cease generating the current.

Additionally, in at least some such embodiments, the method further includes, prior to the causing, receiving a second signal indicating that the third voltage at the first input port of the comparator is less than the second voltage at the second input port of the comparator, where the causing occurs based at least in part upon the receiving of the second signal. Also, in at least some such embodiments, the method further includes setting the second terminal at the first voltage, where the setting includes taking an action resulting in the first voltage being one of ground, a supply voltage, or a third voltage. Additionally, in at least some such embodiments, the method further includes, at another time, either (i) refraining from causing the current source to drive any of the current in response to receiving a second signal indicating that the third voltage is greater than the second voltage, or (ii) further causing the current source to continue driving the current for a full extent of a predetermined time period in response to receiving a third signal indicating throughout the predetermined time period that the third voltage applied to the first input port is less than the second voltage.

Further, in at least some example embodiments, the present invention relates to a system for determining a status of a switch having first and second terminals. The system includes a first port configured to be coupled to the first terminal of the switch, and a capacitor coupled between the first port and ground. The system also includes a comparator device having first and second input ports and an output port, where the first input port is coupled at least indirectly to the first port and where a threshold voltage is applied to the second input port. The system further includes a current source coupled to the first input port, and a control component coupled to the output port and the current source. The control component is configured to control the current source so that the current source intermittently drives current, and the control component is configured so that, in at least one operational circumstance, the control component causes the current source to cease driving the current in response to receiving a first indication from the output port indicating that an additional voltage applied to the first input port has changed from being less than the threshold voltage to being greater than the threshold voltage, the first indication being indicative of the status of the switch.

Additionally, in at least some such embodiments, the system further includes a resistor that couples the first input port with the first port. Further, in at least some such embodiments, the system also includes a diode linking the current source to a power source, and the comparator device includes an operational amplifier. Also, in at least some such embodiments, the control component includes one or more of a logic circuit and a microprocessor. Further, in at least some such embodiments, the threshold voltage is applied at least indirectly by way of a voltage source, and the system includes the switch and the switch is a single pole, single throw (SPST) switch. Also, in at least some such embodiments, the system further includes a ground terminal to which the second terminal is directly coupled such that the switch is coupled directly between the first port and ground, and at least one leakage resistance associated with the capacitor, where the capacitor is selectable from among a plurality of capacitors that can be coupled between the first port and ground. Additionally, in at least some such embodiments, the current source includes one or more of a resistor and a current mirror. Also, in at least some such embodiments, the control component is further configured so that the control component does not cause the current source to drive any of the current in response to receiving a second indication from the output port indicating that the additional voltage applied to the first input port is greater than the threshold voltage. Further, in at least some such embodiments, the control component is further configured so that the control component causes the current source to continue driving the current for a full extent of a predetermined time period in response to receiving a second indication from the output port indicating throughout the predetermined time period that the additional voltage applied to the first input port remains less than the threshold voltage.

Further, in at least some example embodiments, the present invention relates to a circuit configured for interacting with a capacitor and a switch in a manner allowing for determining a status of the switch, the capacitor and switch being coupled together by way of a first node. The circuit includes a comparator device having first and second input ports and an output port, where the first input port is configured to be coupled at least indirectly to the first node, and where the second input port is configured to receive a threshold voltage. The circuit also includes a current source coupled to the first input port, and a control component coupled to the output port and the current source. The control component is configured to control the current source so that the current source intermittently drives current toward the first node, and the control component is configured so that, in at least one operational circumstance, the control component causes the current source to cease driving the current toward the first node in response to receiving a first indication from the output port indicating that an additional voltage applied to the first input port has changed from being less than the threshold voltage to being greater than the threshold voltage, the first indication being indicative of the status of the switch.

Additionally, in at least some such embodiments, the circuit further includes a diode linking the current source to a power source, and the comparator device includes an operational amplifier. Also, in at least some such embodiments, the control component includes one or more of a logic circuit and a microprocessor. Further, in at least some such embodiments, the current source includes one or more of a resistor and a current mirror. Additionally, in at least some such embodiments, the control component is further configured so that, in at least some additional operational circumstances, the control component one or both of (i) refrains from causing the current source to drive any of the current in response to receiving a second indication from the output port indicating that the additional voltage applied to the first input port is greater than the threshold voltage, or (ii) causes the current source to continue driving the current for a full extent of a predetermined time period in response to receiving a third indication from the output port indicating throughout the predetermined time period that the additional voltage applied to the first input port is less than the threshold voltage. Also, in at least some such embodiments, the first input port is coupled to the first node by way of a resistor.

Further, in at least some example embodiments, the present invention relates to a method of determining a status of a switch. The method includes (a) commencing at a first time a first operation of a first timer, where the first timer is configured to expire upon determining that a first predetermined period of time has elapsed since the first time, and receiving a first signal indicating that a first voltage at a first input port of a comparator is less than a second voltage at a second input port of the comparator. The method also includes (c) based at least in part upon the received first signal, causing a current source to generate a current, and (d) receiving, at a second time that occurs after the first time by an amount of time that is less than the first predetermined period of time, a second signal indicating that the first voltage at the first input port of the comparator has switched from being less than the second voltage to being greater than the second voltage. Additionally, the method includes (e) based at least in part upon the received second signal, attaining a determination that the switch has an open status and causing the current source to cease generating the current.

Further, in at least some such embodiments, the method further includes (f) at a third time that is identical to or prior to the first time, additionally commencing a second operation of a second timer, where the second timer is configured to expire upon determining that a second predetermined period of time has elapsed since the third time; and (g) subsequent to the second time and the attaining of the determination, determining that the second predetermined period of time has elapsed since the third time. Additionally, in at least some such embodiments, at least one circuit component enters an awakened or on mode of operation at the first time or the third time, and enters a sleep or off or low power mode based at least in part upon the received second signal. Also, in at least some such embodiments, the method further includes repeating (a) at an additional time subsequent to the first time, additionally repeating (b) and (c), additionally continuing to cause the current source to generate the current until the first predetermined period of time has elapsed since the additional time, and attaining an additional determination that the switch has a closed status. Further, in at least some such embodiments, the method further includes repeating (a) at an additional time subsequent to the first time, and attaining an additional determination that the switch has the open status upon immediately receiving an additional signal indicating that an additional voltage at the first input port of the comparator is greater than the second voltage at the second input port of the comparator.

While the principles of the invention have been described above in connection with specific apparatus, it is to be clearly understood that this description is made only by way of example and not as a limitation on the scope of the invention. It is specifically intended that the present invention not be limited to the embodiments and illustrations contained herein, but include modified forms of those embodiments including portions of the embodiments and combinations of elements of different embodiments as come within the scope of the following claims.

What is claimed is:

1. A system for determining a status of a switch having first and second terminals, the system comprising:
   a first port configured to be coupled to the first terminal of the switch;
   a capacitor coupled between the first port and ground;
   a comparator device having first and second input ports and an output port, wherein the first input port is coupled at least indirectly to the first port and wherein a threshold voltage is applied to the second input port;
   a current source coupled to the first input port; and
   a control component coupled to the output port and the current source,
   wherein the control component is configured to control the current source so that the current source intermittently drives current,
   wherein the control component is configured so that, in at least a first operational circumstance in which the switch is open, the control component causes the current source to cease driving the current in response to receiving a first indication from the output port indicating that an additional voltage applied to the first input port has changed from being less than the threshold voltage to being greater than the threshold voltage, the first indication being indicative of the status of the switch,
   wherein the control component is further configured so that, in at least a second operational circumstance in which the switch is closed, the control component causes the current source to continue driving the current for a full extent of a predetermined time period in response to receiving a second indication from the output port indicating throughout the predetermined time period that the additional voltage applied to the first input port remains less than the threshold voltage, and
   wherein the control component is further configured so that, in at least a third operational circumstance in which the switch is open, the control component does not cause the current source to drive any of the current in response to receiving a third indication from the output port indicating that the additional voltage applied to the first input port is greater than the threshold voltage.

2. The system of claim 1, further comprising a resistor that couples the first input port with the first port.

3. The system of claim 2, further comprising a diode linking the current source to a power source, and wherein the comparator device includes an operational amplifier.

4. The system of claim 1, wherein the control component includes one or more of a logic circuit and a microprocessor.

5. The system of claim 4, wherein the threshold voltage is applied at least indirectly by way of a voltage source, and wherein the system includes the switch and the switch is a single pole, single throw (SPST) switch.

6. The system of claim 5, further including a ground terminal to which the second terminal is directly coupled such that the switch is coupled directly between the first port and ground, and at least one leakage resistance associated with the capacitor.

7. The system of claim 4, wherein the current source includes one or more of a resistor and a current mirror.

8. The system of claim 1 wherein, in at least one or more circumstances, a holding current less than the current is driven by the current source to avoid leak down of the capacitor.

9. The system of claim 8, wherein the control component is configured to cause the current source to generate the current in one or more manners that are operational-circumstance dependent or time-varying.

10. The system of claim 9, wherein the threshold voltage that is applied can vary depending upon one or more operational or selection criteria.

11. A circuit configured for interacting with a capacitor and a switch in a manner allowing for determining a status of the switch, the capacitor and switch being coupled together by way of a first node, the circuit comprising:
    a comparator device having first and second input ports and an output port, wherein the first input port is configured to be coupled at least indirectly to the first node, and wherein the second input port is configured to receive a threshold voltage;
    a current source coupled to the first input port; and
    a control component coupled to the output port and the current source,
    wherein the control component is configured to control the current source so that the current source intermittently drives current toward the first node,
    wherein the control component is configured so that, in at least a first operational circumstance in which the switch is open, the control component causes the current source to cease driving the current toward the first node in response to receiving a first indication from the output port indicating that an additional voltage applied to the first input port has changed from being less than the threshold voltage to being greater than the threshold voltage, the first indication being indicative of the status of the switch, and
    wherein the control component is further configured so that the control component (i), in at least a second operational circumstance in which the switch is open, refrains from causing the current source to drive any of the current in response to receiving a second indication from the output port indicating that the additional voltage applied to the first input port is greater than the threshold voltage, and (ii), in at least a third operational circumstance in which the switch is closed, causes the current source to continue driving the current for a full extent of a predetermined time period in response to receiving a third indication from the output port indicating throughout the predetermined time period that the additional voltage applied to the first input port is less than the threshold voltage.

12. The circuit of claim 11, further comprising a diode linking the current source to a power source, and wherein the comparator device includes an operational amplifier.

13. The circuit of claim 11, wherein the control component includes one or more of a logic circuit and a microprocessor.

14. The circuit of claim 11, wherein the current source includes one or more of a resistor and a current mirror.

15. The system of claim 11, wherein the first input port is coupled to the first node by way of a resistor.

* * * * *